(12) United States Patent
Hwang et al.

(10) Patent No.: US 7,224,424 B2
(45) Date of Patent: May 29, 2007

(54) DRIVE IC AND DISPLAY DEVICE HAVING THE SAME

(75) Inventors: Seong-Yong Hwang, Yongin-si (KR);
Sung-Chul Kang, Yongin-si (KR);
Weon-Sik Oh, Osan-si (KR);
Cheol-Yong Jeong, Seoul (KR);
Jin-Suk Lee, Yongin-si (KR);
Ju-Young Yoon, Yongin-si (KR);
Won-Gu Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 160 days.

(21) Appl. No.: 10/720,652

(22) Filed: Nov. 24, 2003

(65) Prior Publication Data

US 2004/0165138 A1 Aug. 26, 2004

(30) Foreign Application Priority Data

Feb. 20, 2003 (KR) .................. 10-2003-0010819

(51) Int. Cl.
*G02F 1/1345* (2006.01)
(52) U.S. Cl. .................. 349/152; 257/59; 257/72; 349/149
(58) Field of Classification Search ......... 349/149–152
See application file for complete search history.

(56) References Cited

U.S. PATENT DOCUMENTS 4,136,356 A * 1/1979 Kusano .................. 257/692
5,555,116 A * 9/1996 Ishikawa et al. ............ 349/149
5,712,493 A * 1/1998 Mori et al. ................. 257/59
6,091,475 A * 7/2000 Ogino et al. ............... 349/149
6,147,739 A * 11/2000 Shibatani ................... 349/152
6,198,522 B1 * 3/2001 Yanagi ...................... 349/152
6,297,868 B1 * 10/2001 Takenaka et al. ........... 349/151
6,678,028 B2 * 1/2004 Yamate et al. .............. 349/151
6,738,123 B1 * 5/2004 Takahashi et al. .......... 349/152
6,894,758 B1 * 5/2005 Hagiwara et al. ........... 349/152
6,954,249 B2 * 10/2005 Muramatsu et al. ........ 349/149
2002/0100974 A1 * 8/2002 Uchiyama .................. 257/737

FOREIGN PATENT DOCUMENTS

JP 64-70727 * 3/1989

* cited by examiner

*Primary Examiner*—Andrew Schechter
*Assistant Examiner*—Richard Kim
(74) *Attorney, Agent, or Firm*—Cantor Colburn LLP

(57) ABSTRACT

In a drive IC and a display device having the same, the drive IC includes a plurality of bumps disposed on a lower surface of the drive IC and aligned in a plurality of rows along an edge of the drive IC. The bumps aligned in different rows from each other are juxtaposed in a direction perpendicular to a direction in which the bumps are aligned. Accordingly, when the drive IC is mounted on a display panel using an anisotropic conductive film, the anisotropic conductive film may be smoothly flowed through a space defined by the bumps of the drive IC, thereby improving electric properties of the drive IC and display device.

12 Claims, 14 Drawing Sheets

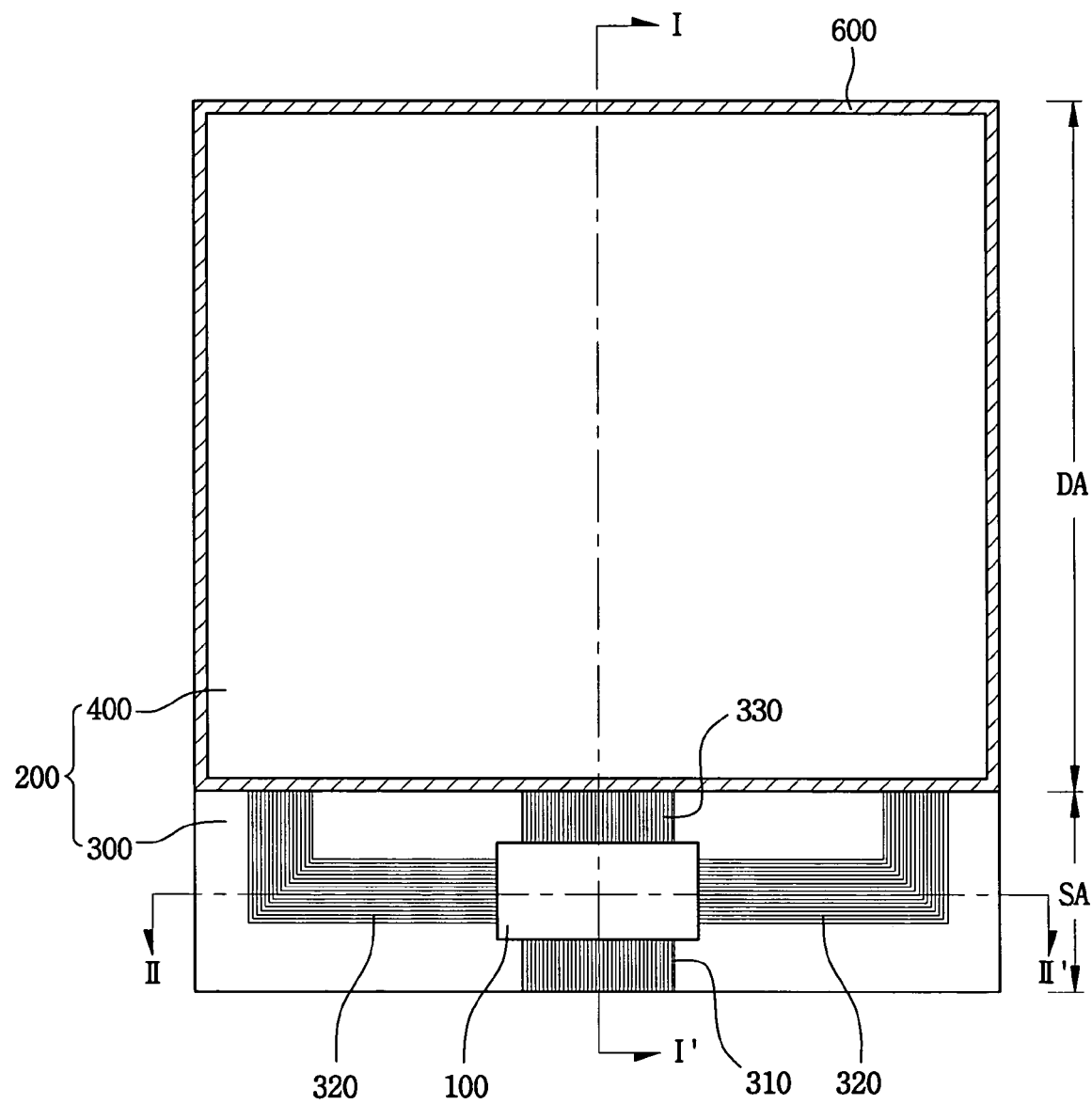

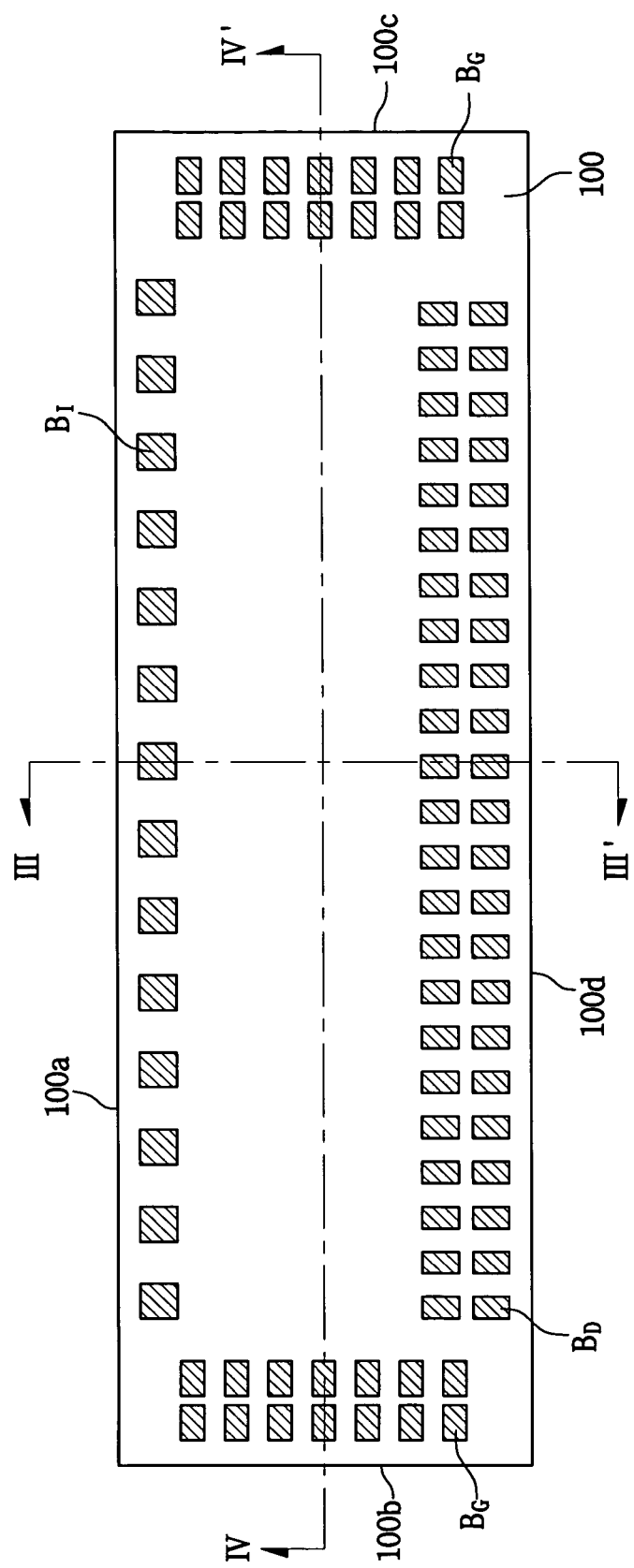

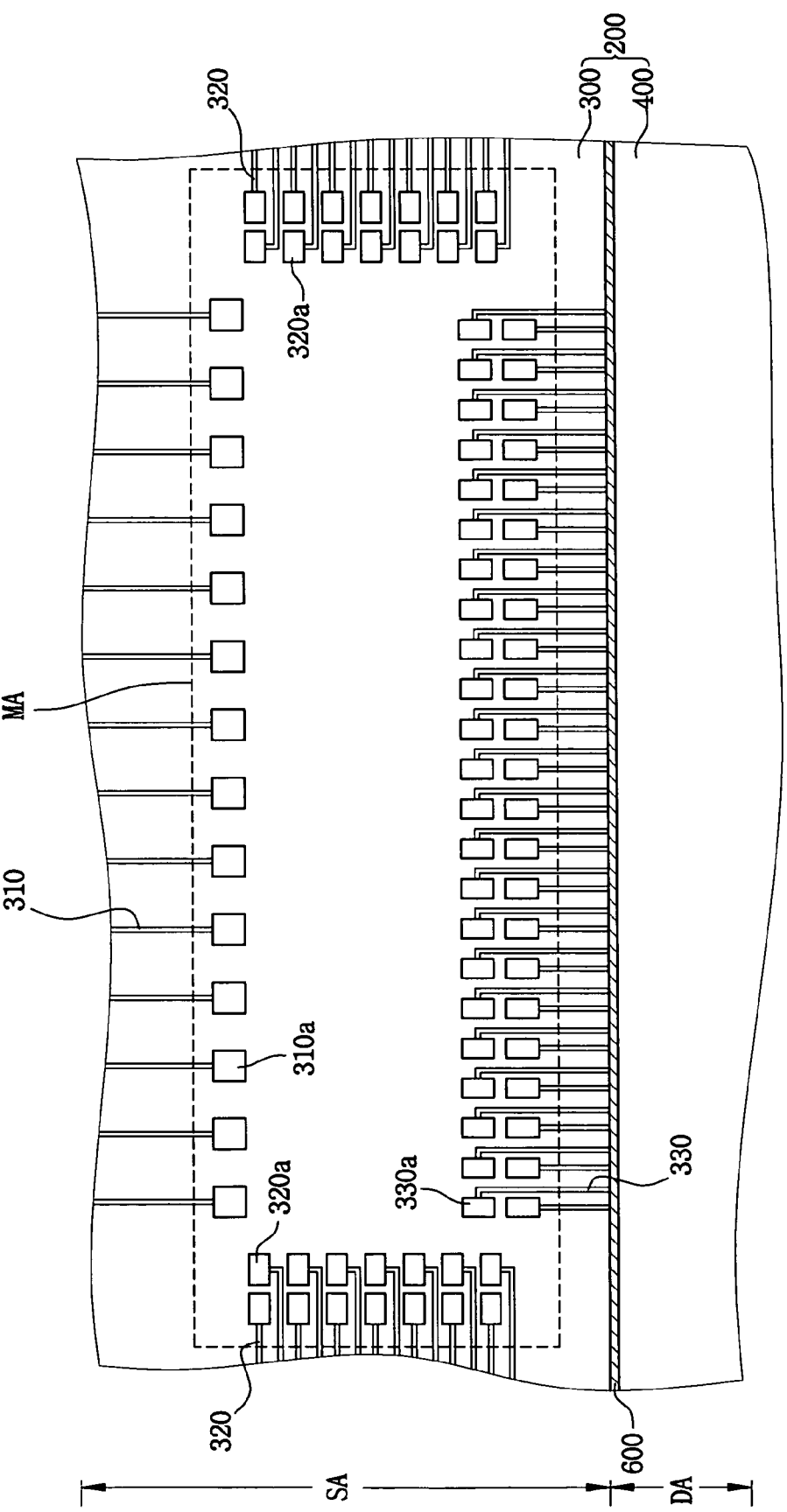

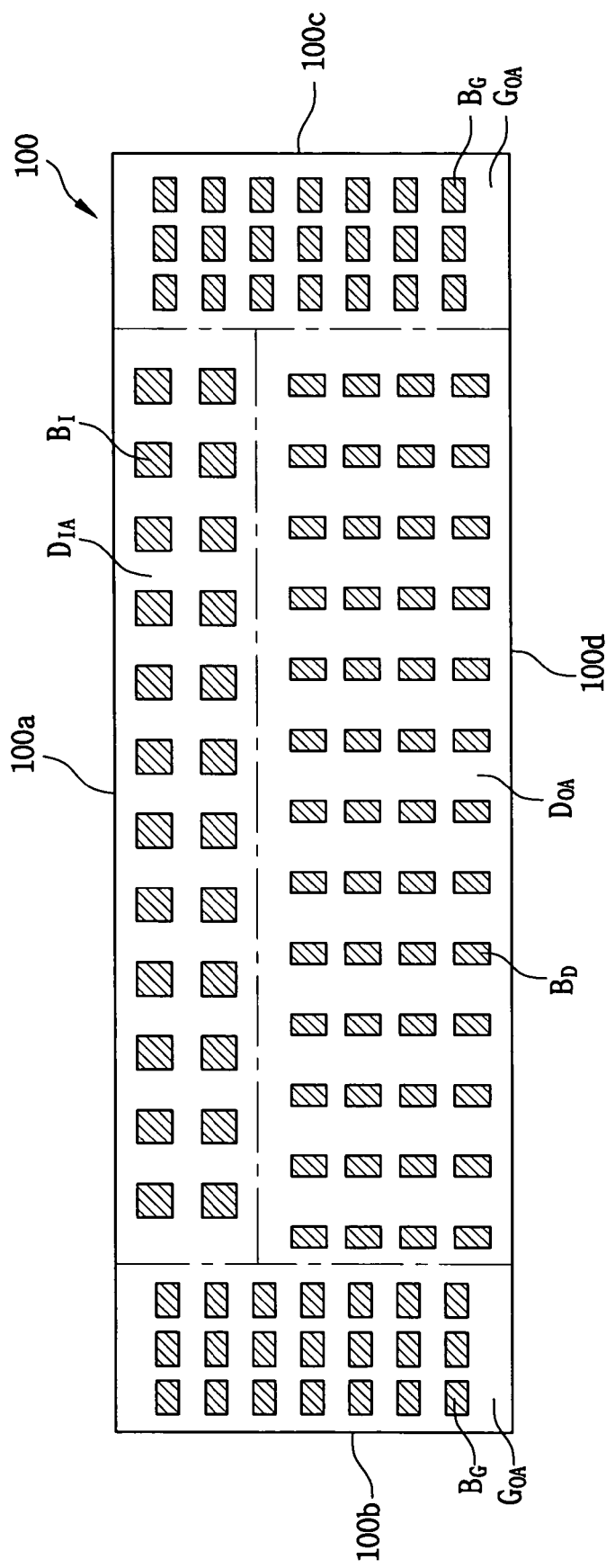

DRIVE IC AND DISPLAY DEVICE HAVING THE SAME

CROSS-REFERENCE TO RELATED APPLICATION

This application relies for priority upon Korean Patent Application No. 2003-10819 filed on Feb. 20, 2003, the contents of which are herein incorporated by reference in its entirety.

BACKGROUND OF THE INVENTION

1. Field of the Invention

The present invention relates to a drive IC (Integrated Circuit) and a display device having the same, and more particularly to a drive IC having an electrically improved reliability and a display device having the same.

2. Description of the Related Art

Recently, electronic instruments, for example, such as a mobile communication terminal, a digital camera, a notebook computer, etc., include an image display device so as to display an image. As an image display device, a flat panel display device, representatively such as an LCD (Liquid Crystal Display) device, is mainly used.

The LCD device, generally, includes a drive IC mounted on an LCD panel thereof. Particularly, a mobile communication terminal needs an LCD device having low power consumption and slim-type small size.

The LCD device having the slim-type small size is driven by means of a drive IC so-called one chip IC. In recent, an LCD device to which a COG (Chip On Glass) manner is applied is broadly used. The COG manner is a method that a drive IC is directly mounted on an LCD panel.

In the LCD panel to which the COG manner is applied, an ACF (Anisotropic Conductive Film) including a resin with a conductive ball is positioned on a plurality of electrode pads formed on the LCD panel and the drive IC is compressed with the electrode pads. A plurality of bumps disposed under the drive IC is electrically connected to the electrode pads through the conductive ball.

The ACF is outwardly extruded from the drive IC due to compression of the drive IC while the drive IC is mounted on the LCD panel. However, the conductive ball is moved to an outside of the drive IC with the resin and stacked up on a peripheral area of the bumps by colliding with bumps.

As a result, the bumps on which the conductive ball is stacked up may be electrically shorted to adjacent bumps. Also, since an adhesive force between the bumps and the conductive ball is deteriorated, an electrical connection between the drive IC and the electric pads may be opened.

BRIEF SUMMARY OF THE INVENTION

The present invention provides a drive IC having an electrically improved reliability.

The present invention also provides a display device having the above drive IC.

In one aspect of the invention, a drive IC includes electrode terminals aligned in a plurality of columns along a first direction parallel to an edge line of a semiconductor substrate and aligned in a plurality of rows along a second direction perpendicular to the first direction, and bumps disposed on the electrode terminal.

In another aspect of the invention, a drive IC includes electrode terminals aligned in a plurality of columns along a first direction parallel to an edge line of a semiconductor substrate and bumps disposed on the electrode terminals. The electrode terminals include first electrode terminals aligned in a first column and second electrode terminals aligned in a second column adjacent to the first column. Distances between adjacent two first electrode terminals are uniform and the second electrode terminals are positioned at areas corresponding to areas between the first electrode terminals aligned in the first column.

Each of the bumps has a predetermined length extended in a second direction perpendicular to the first direction. The bumps include first bumps disposed on the first electrode terminals and second bumps disposed on the second electrode terminals. The second bumps are separated from the first bumps and the separated distance between the first and second bumps is greater than a half of the predetermined length.

In further aspect of the invention, a display device includes a display panel and a drive IC electrically connected to the display panel.

The display panel includes a display area on which a gate line, a data line perpendicular to the gate line and a plurality of pixels are formed and a peripheral area on which electrode pads extended from the gate and data lines are formed. The peripheral area is disposed adjacent to the display area.

The drive IC includes electrode terminals aligned in a plurality of columns along a first direction parallel to an edge line of a semiconductor substrate and aligned in a plurality of rows along a second direction perpendicular to the first direction and bumps disposed on the electrode terminal.

In further aspect of the invention, a display device includes a display panel and a drive IC electrically connected to the LCD panel.

The display panel includes a display area on which a gate line, a data line perpendicular to the gate line and a plurality of pixels are formed and a peripheral area on which electrode pads extended from the gate and data lines are formed. The peripheral area is disposed adjacent to the display area.

The drive IC includes electrode terminals aligned in a plurality of columns along a first direction parallel to an edge line of a semiconductor substrate and bumps disposed on the electrode terminals.

The electrode terminals comprise first electrode terminals aligned in a first column and second electrode terminals aligned in a second column adjacent to the first column. The distances between adjacent two first electrode terminals are uniform and the second electrode terminals are positioned at areas corresponding to areas between the first electrode terminals aligned in the first column.

Each of the bumps has a predetermined length extended in a second direction perpendicular to the first direction. The bumps comprise first bumps disposed on the first electrode terminals and second bumps disposed on the second electrode terminals. The second bumps are separated from the first bumps and the separated distance between the first and second bumps is greater than a half of the predetermined length.

According to the drive IC and the display device having the same, bumps are disposed on a lower surface of the drive IC facing the display panel. The bumps are sufficiently spaced apart from each other so as to allow an anisotropic conductive film to be smoothly flowed between the bumps.

Thus, conductive balls of the anisotropic conductive film is not stacked up on the peripheral area adjacent to the bumps, thereby preventing the bumps from being electrically connected to each other and an adhesive force between the drive IC and the display panel from being deteriorated.

BRIEF DESCRIPTION OF THE DRAWINGS

The above and other advantages of the present invention will become readily apparent by reference to the following detailed description when considered in conjunction with the accompanying drawings wherein:

FIG. 1 is a schematic plan view showing an LCD device having a drive IC according to an exemplary embodiment of the present invention;

FIG. 2 is a schematic view showing a drive IC shown in FIG. 1;

FIG. 4 is an enlarged view showing a peripheral area of an LCD panel on which a drive IC is mounted shown in FIG. 2;

FIG. 12 is a schematic view showing a drive IC according to another exemplary embodiment of the present invention.

DETAILED DESCRIPTION OF THE INVENTION

In exemplary embodiments of the present invention, an LCD device will be described among various display devices in order to illustrate a drive IC and a display device having the same.

FIG. 1 is a schematic plan view showing an LCD device having a drive IC according to an exemplary embodiment of the present invention.

Referring to FIG. 1, an LCD device 1000 includes a drive IC 100 and an LCD panel 200 on which the drive IC 100 is mounted.

The LCD panel 200 includes a TFT (Thin Film Transistor) substrate 300, a color filter substrate 400 combined with the TFT substrate 300 and a liquid crystal layer (not shown) interposed between the TFT substrate 300 and the color filter substrate 400.

The LCD panel 200 further includes a sealant 600 disposed between the TFT substrate 300 and the color filter substrate 400 and positioned at an edge of the LCD panel 200. The sealant 600 combines the TFT substrate 300 with the color filter substrate 400 and prevents the liquid crystal interposed between the TFT substrate 300 and the color filter substrate 400 from leaking.

The LCD panel 200 is divided into a pixel area DA where the TFT substrate 300 is overlapped with the color filter substrate 400 so as to display an image and a peripheral area SA on which the drive IC 100 is mounted so as to drive the pixel area DA.

The TFT substrate 300 includes a plurality of gate lines 320 and a plurality of data lines 330 formed at the pixel area DA and perpendicular to each other. The TFT substrate 300 also includes a plurality of input lines 310 formed at the peripheral area SA so as to receive a predetermined signal from an external. The gate and data lines 320 and 330 extended from the pixel area DA are electrically connected to the drive IC 100 at the peripheral area SA.

Although not shown in FIG. 1, the TFT substrate 300 may include a plurality of drive ICs formed at the peripheral area SA. In this case, each of the drive ICs may be electrically connected to the gate and data lines.

Figure 3A:
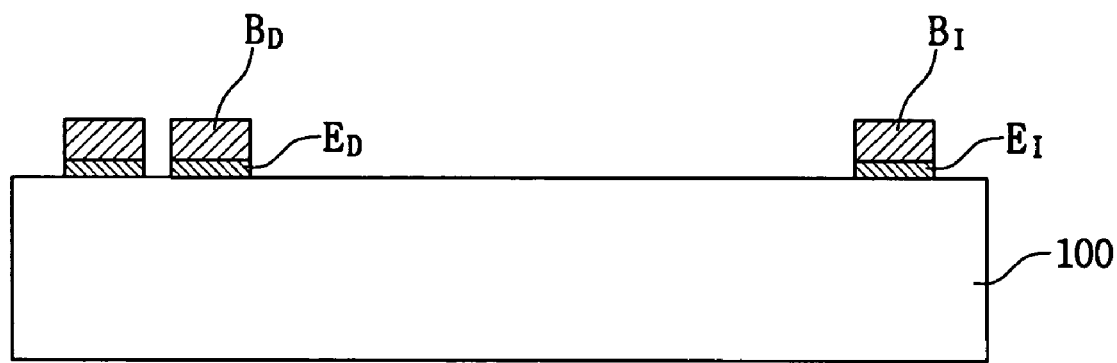
FIGS. 3A and 3B are cross-sectional views showing a drive IC shown in FIG. 2.

FIG. 2 is a schematic view showing a drive IC shown in FIG. 1. FIG. 3A is a cross-sectional view taken along the line III–III' for showing a structure of a drive IC shown in FIG. 2 and FIG. 3B is a cross-sectional view taken along the line IV–IV' for showing a drive IC shown in FIG. 2.

Figure 3B:
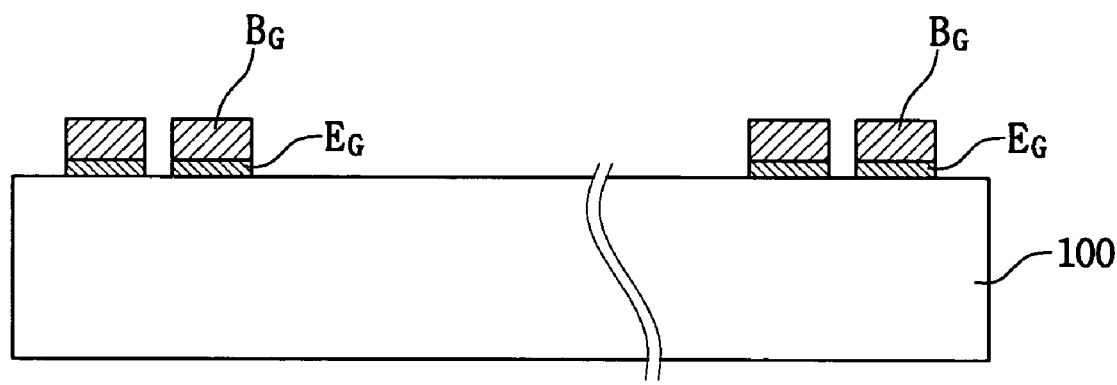

Referring to FIGS. 2 to 3B, the drive IC 100 includes a plurality of electrode terminals $E_I$, $E_G$ and $E_D$ formed on a lower surface of a semiconductor substrate and a plurality of bumps $B_I$, $B_G$ and $B_D$ formed on the electrode terminals $E_I$, $E_G$ and $E_D$. Particularly, a plurality of electrode terminals for input line $E_I$ (hereinafter, referred to as an input line electrode terminals) a plurality of electrode terminals for gate line $E_G$ (hereinafter, referred to as a gate line electrode terminals) and a plurality of electrode terminals for data line $E_D$ (hereinafter, referred to as a data line electrode terminals) are formed on the lower surface of the drive IC 100, which is facing the LCD panel 200 shown in FIG. 1. Also, a plurality of bumps for the input line $B_I$ (hereinafter, referred to as an input line bumps), a plurality of bumps for the gate line $B_G$ (hereinafter, referred to as a gate line bumps) and a plurality of bumps for data line $B_D$ (hereinafter, referred to as a data line bumps) are disposed on the input line electrode terminals $E_I$, gate line electrode terminals $E_G$ and data line electrode terminals $E_D$, respectively.

The input line bumps $B_I$ are arranged along a first edge 100a of the lower surface of the drive IC 100, the gate line bumps $B_G$ are arranged along second and third edges 100b and 100c positioned at both sides of the first edge 100a, and the data line bumps $B_D$ are arranged along a fourth edge 100d parallel to the first edge 100a.

The gate line bumps $B_G$ are arranged in two columns along the second and third edges 100b and 100c, respectively. The gate line bumps $B_G$ arranged in different columns from each other and adjacent to each other are also juxtaposed in a direction parallel to the first edge 100a of the drive IC 100. The data line bumps $B_D$ are arranged in two rows along the fourth edge 100d and the data line bumps $B_D$ arranged in different rows from each other and adjacent to each other are also juxtaposed in a direction parallel to the second edge 100b of the drive IC 100.

In FIG. 2, the gate line bumps $B_G$ and the data line bumps $B_D$ of the drive IC 100 arranged in two columns or rows have been described. However, the gate line bumps $B_G$ and the data line bumps $B_D$ may be arranged in three or more columns or rows, respectively. Also, a number of the input line bumps $B_I$, gate line bumps $B_G$ and data line bumps $B_D$ may increase or decrease according to the LCD device 1000.

FIG. 4 is an enlarged view showing a peripheral area of a liquid crystal display panel on which a drive IC is mounted shown in FIG. 2.

Referring to FIG. 4, the peripheral area SA of the LCD panel 200 is provided with a mounting area MA on which the drive IC 100 is mounted.

A plurality of input line electrode pads 310a, a plurality of gate line electrode pads 320a and a plurality of data line electrode pads 330a are formed at the mounting area MA.

The input line electrode pads 310a are connected to ends of the input lines 310 that receives the predetermined signal from the external, respectively, the gate line electrode pads 320a are connected to ends of the gate lines 320 extended from the pixel area DA, respectively and the data line electrode pads 330a are connected to ends of the data lines 330 extended from the pixel area DA, respectively.

The gate line electrode pads 320 have a width wider than that of the gate lines 320, so that the gate line electrode pads 320a are arranged in a plurality of columns so as to arrange the gate line electrode pads 320a within the mounting area MA.

In FIG. 4, the gate line electrode pads 320a are arranged at positions corresponding to the gate line bumps $B_G$ of the drive IC 100 shown in FIG. 2. That is, the gate line electrode pads 320a are arranged in two columns and the gate line electrode pads 320a arranged in different columns from each other and adjacent to each other are also juxtaposed in a direction parallel to the first edge 100a of the drive IC 100.

Also, the data line electrode pads 330a are arranged at positions corresponding to the data line bumps $B_D$ of the drive IC 100 shown in FIG. 2. That is, the data line electrode pads 330a are arranged in two columns and the data line electrode pads 330a arranged in different columns from each other and adjacent to each other are also juxtaposed in a direction parallel to the second edge 100b of the drive IC 100.

Thus, the input line electrode pads 310a, gate line electrode pads 320a and data line electrode pads 330a arranged in the mounting area MA of the LCD panel 200 are electrically connected to the input line bumps $B_I$, gate line bumps $B_G$ and data line bumps $B_D$ arranged in the drive IC 100, respectively.

Figure 5A:
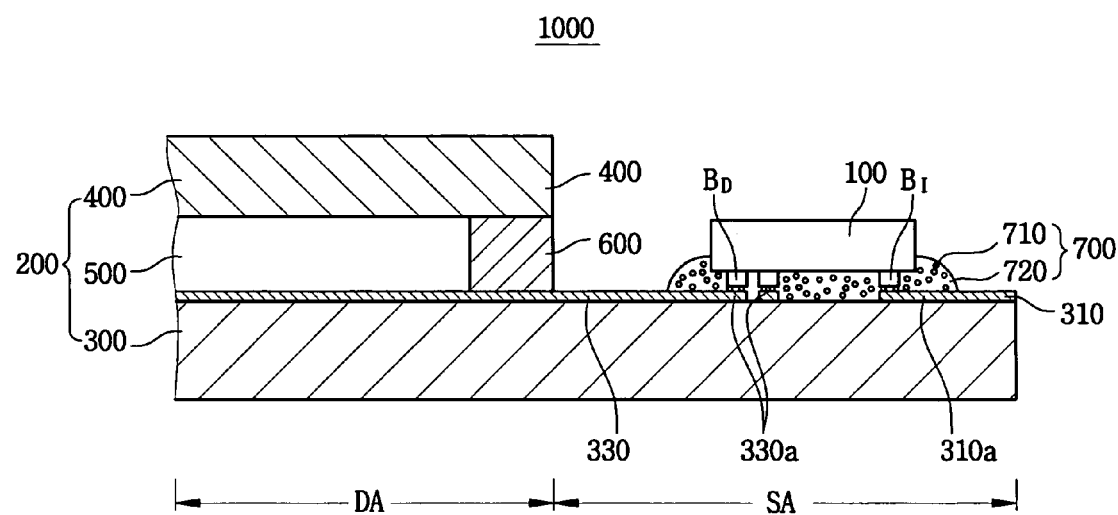
FIGS. 5A and 5B are cross-sectional views showing an LCD device shown in FIG. 1.
Figure 5B:
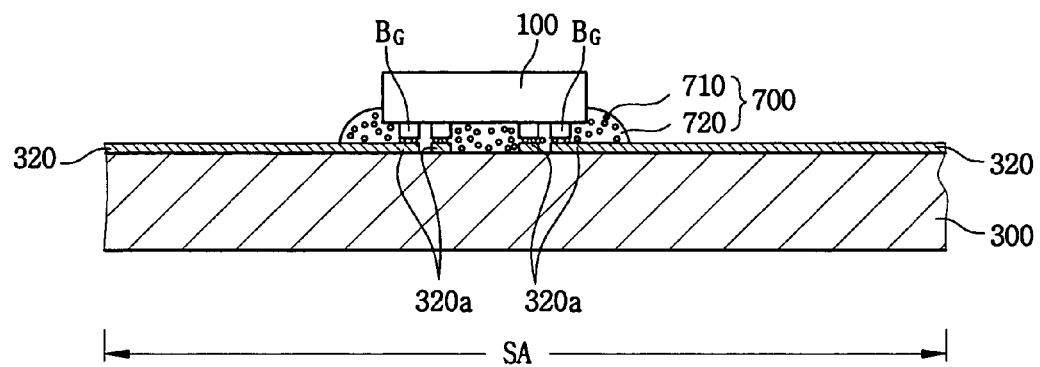

FIG. 5A is a cross-sectional view taken along the line I–I' for showing an LCD device shown in FIG. 1 and FIG. 5B is a cross-sectional view taken along the line II–II' for showing an LCD device shown in FIG. 1.

Referring to FIGS. 5A and 5B, the LCD device 1000 includes the LCD panel 200 having the pixel and peripheral areas DA and SA and the drive IC 100 mounted on the peripheral area SA by means of a fixing member 700.

The drive IC 100 is electrically connected to the input line electrode pads 310a, gate line electrode pads 320a and data line electrode pads 330a arranged at the peripheral area SA of the LCD panel 200 by means of the fixing member 700.

The fixing member 700 may include an ACF (Anisotropic Conductive Film), a non-conductive film or a solder. In this exemplary embodiment, the fixing member 700 including the ACF will be described and the ACF is represented by a reference numeral "700".

The ACF 700 includes a conductive ball 710 and a resin 720 mixed with the conductive ball 710 and is disposed between the drive IC 100 and the LCD panel 200. The conductive ball 710 electrically connects the drive IC 100 to the LCD panel 200 and the resin 720 fixes the drive IC and the LCD panel 200 to each other.

Hereinafter, a manner for mounting the drive IC 100 on the LCD panel 200 will be described.

The ACF 700 is coated over the input line electrode pads 310a, gate line electrode pads 320a and data line electrode pads 330a of the LCD panel 200.

The drive IC 100 on which the input line bumps $B_I$, gate line bumps $B_G$ and data line bumps $B_D$ are mounted are compressed with the peripheral area SA such that the input line bumps $B_I$, gate line bumps $B_G$ and data line bumps $B_D$ correspond to the input line electrode pads 310a, gate line electrode pads 320a and data line pads 330a, respectively.

Thus, the input line bumps $B_I$, gate line bumps $B_G$ and data line bumps $B_D$ of the drive IC 100 are electrically connected to the input line electrode pads 310a, gate line electrode pads 320a and data line electrode pads 330a, respectively while the input line bumps $B_I$, gate line bumps $B_G$ and data line bumps $B_D$ of the drive IC 100 compresses the conductive ball 710.

The resin 720 has a reduced viscosity due to a high heat generated while the drive IC 100 is compressed with the peripheral area SA. The resin 720 having the reduced viscosity is extruded outside the drive IC 100 with the conductive ball 710 that is not compressed between the drive IC 100 and LCD panel 200 and gradually hardened, thereby mounting the drive IC 100 on the peripheral area SA of the LCD panel 200.

Figure 6:
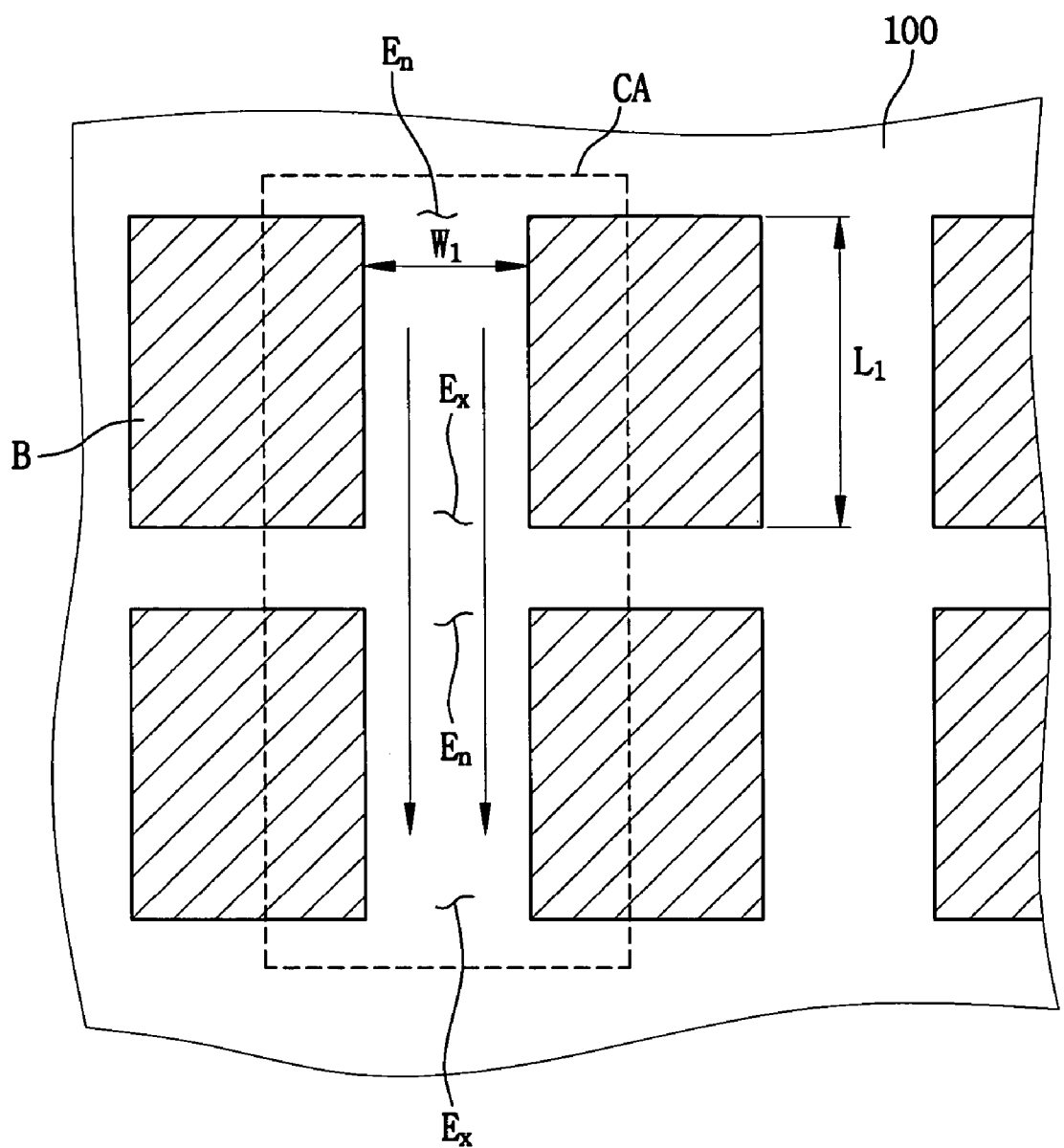
FIG. 6 is a partially enlarged view showing an energy loss due to bumps of a drive IC shown in FIG. 2.

FIG. 6 is a partially enlarged view showing an energy loss due to bumps of a drive IC shown in FIG. 2. In FIG. 6, the gate line bumps $B_G$ or data line bumps $B_D$ shown in FIG. 2 will be described as an exemplary embodiment and represented by a reference numeral "B".

Referring to FIG. 6, the bumps "B" of the drive IC 100 are arranged in two rows and the bumps "B" arranged in different rows from each other and adjacent to each other are also juxtaposed in a direction perpendicular to a direction in which the bumps "B" are arranged. The bumps "B" have a predetermined height (not shown) "H" and a first length $L_1$, and the bumps "B", which are arranged in a same row and adjacent to each other, are separated from each other with a first distance $W_1$.

When the drive IC 100 is mounted on the LCD panel 200 using the ACF 700 shown in FIGS. 5A and 5B, the ACF 700 is extruded outside the drive IC 100 due to the compression of the drive IC 100.

In order to consider a frictional loss per unit mass due to the bump "B" when the ACF 700 is extruded outside the drive IC 100, an inspection area CA is defined as shown in FIG. 6.

The inspection area CA is defined by four bumps "B" adjacent to each other and provided with two inlets En and two outlets Ex. An equation for frictional loss at a conventional duct having a rectangular shape is represented by the following equation (1).

$$E_f = 2(L/D_e)V^2 f + \tfrac{1}{2} e_{f1} V^2 + \tfrac{1}{2} e_{f2} V^2 \quad (1)$$

Assuming that the inspection area CA defined by the bumps "B" of the drive IC 100 mounted on the LCD panel 200 is the rectangular-shaped duct, the frictional loss per unit mass of the ACF 700 is represented by the following equation (2)

$$E_f = 2(L/D_e)V^2 f + 2*\tfrac{1}{2} e_{f1} V^2 + 2*\tfrac{1}{2} e_{f2} V^2 \quad (2)$$

In the above equation (2), $E_f$ is the frictional loss per unit mass of the ACF 700, L is a first length L1 of the bumps "B", De is an equivalent diameter, V is an average flow rate of the ACF 700 flowing inside the inspection area CA, f is a friction factor, $e_{f1}$ is a loss coefficient (hereinafter, referred to as an entrance loss coefficient) at an entrance En of the inspection area CA and $e_{f2}$ is a loss coefficient (hereinafter, referred to as an exit loss coefficient) at an exit Ex of the inspection area CA, respectively.

The frictional loss at the entrance En and the exit Ex is two times as large as the frictional loss represented by the above equation (1) because the inspection area CA has two entrances En and two exits Ex. In the inspection area CA, since frictional loss at exits arranged in a direction in which the bumps "B" are aligned is negligible quantity, the frictional loss at exits arranged in the direction in which the bumps "B" are aligned is not considered in this exemplary embodiment.

The equivalent diameter (De) is represent by the following equation (3).

$$De = (4*Cd)/Pl = 4*(W_1*2L)/2*(W_1+H) \qquad (3)$$

In the above equation (3), Cd is a cross-sectional dimension, Pl is a peripheral length, L is a first length $L_1$ of the bumps "B", $W_1$ is a distance between the bumps "B" arranged in a same column and adjacent to each other and H is a height of the bumps "B", respectively.

Accordingly, the frictional loss per unit mass of the ACF 700 flowing inside a space formed by the bumps "B" using the above equations (2) and (3).

FIGS. 7A to 7F are schematic views showing various bump shapes of a drive IC according to an exemplary embodiment of the present invention.

Referring to FIGS. 7A to 7F, the bumps "B" may have various shapes in order to reduce the frictional loss at the entrance En and the exit Ex as represented by the above equation (2).

Figure 7A:
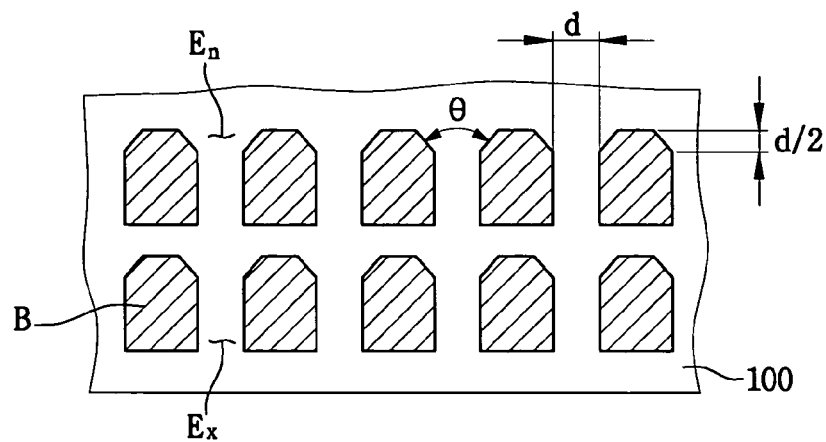
FIGS. 7A to 7F are schematic views showing bump shapes of a drive IC according to an exemplary embodiment of the present invention.

In the drive IC 100 shown in FIG. 7A, corners of the bumps "B" that are adjacent to the entrance En are chamfered so as to reduce the frictional loss at the entrance En.

For example, assuming that an angle θ widened at the entrance En defined by the bumps "B" adjacent to each other is about 45 degrees and a depth of the widened entrance En is a half of a distance "d" between the bumps "B" adjacent to each other, an entrance loss coefficient of the drive IC 100 shown in FIG. 7A is about one-sixth with respect to the entrance loss coefficient $e_{f1}$ represented by the above equation (2), thereby reducing the frictional loss.

Figure 7B:
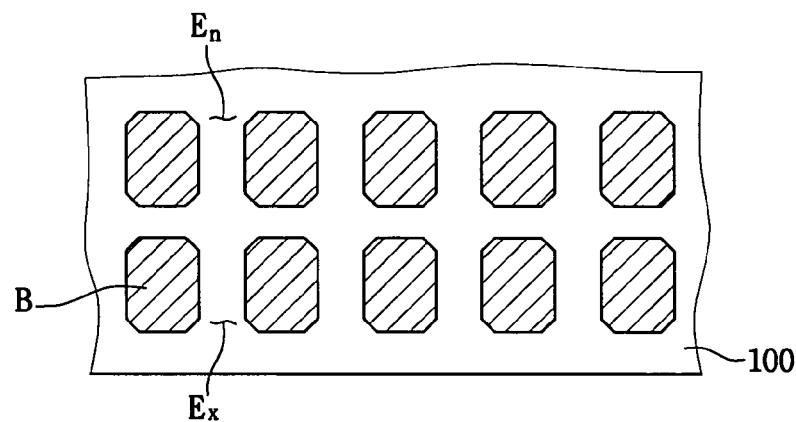

In the drive IC 100 shown in FIG. 7B, corners of the bumps "B" that are respectively adjacent to the entrance En and the exit Ex are chamfered. Entrance and exit loss coefficients of the drive IC 100 shown in FIG. 7B have a smaller value than the entrance and exit loss coefficients $e_{f1}$ and $e_{f2}$ represented by the above equation (2).

Figure 7C:
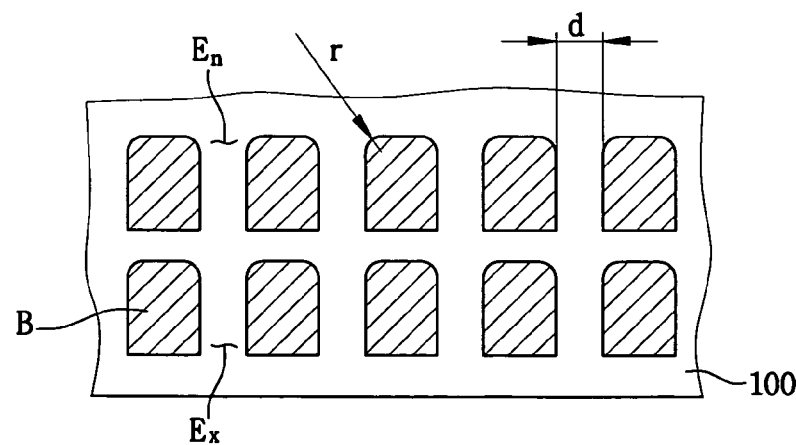

In the drive IC 100 shown in FIG. 7C, corners of the bumps "B" that are adjacent to the entrance En are rounded so as to reduce the frictional loss at the entrance En.

For example, when a radius of curvature "r" of the rounded corners and a distance "d" between the bumps "B" adjacent to each other is satisfied a condition of r/d=0.1, an entrance loss coefficient of the drive IC 100 shown in FIG. 7C is about one-third with respect to the entrance loss coefficient $e_{f1}$ represented by the above equation (2), thereby reducing the frictional loss.

Figure 7D:
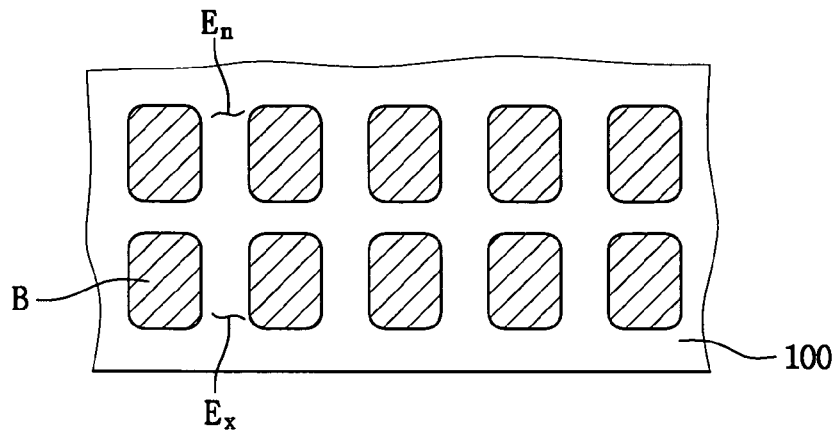

In the drive IC 100 shown in FIG. 7D, corners of the bumps "B" that are respectively adjacent to the entrance En and the exit Ex are rounded. Thus, Entrance and exit loss coefficients of the drive IC 100 shown in FIG. 7D have a smaller value than the entrance and exit loss coefficients $e_{f1}$ and $e_{f2}$ represented by the above equation (2).

Figure 7E:
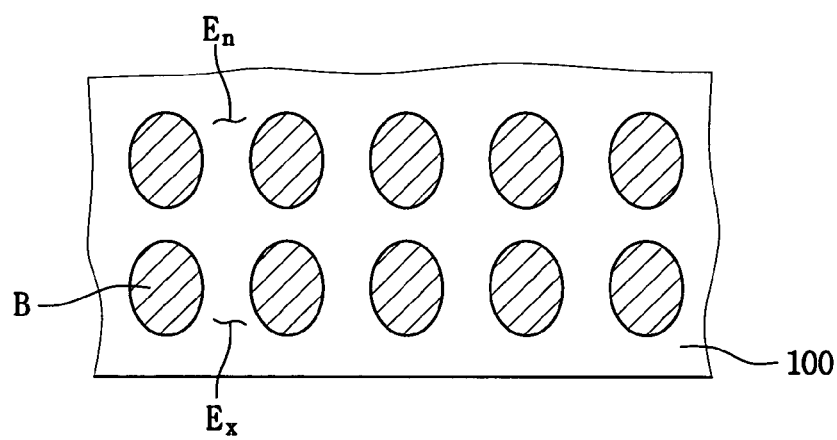
Figure 7F:
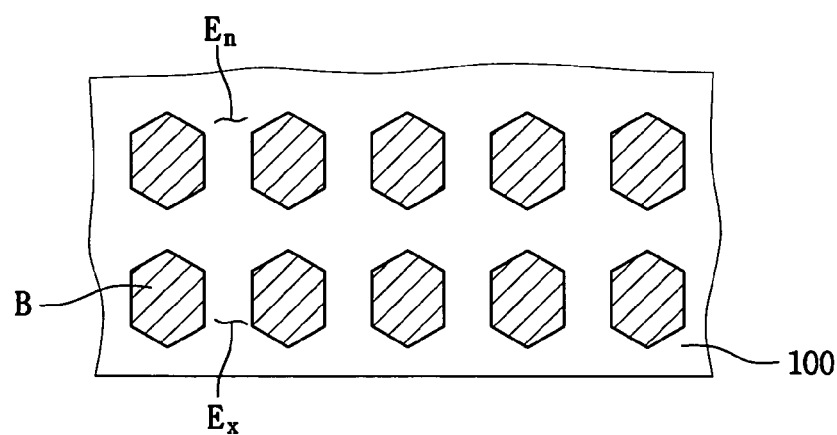

Also, since the drive IC 100 shown in FIG. 7E has an oval shape and the drive IC 100 shown in FIG. 7F has a hexagon when viewed from an upper side of the drive IC 100, entrance and exit loss coefficients of the drive IC 100 shown in FIGS. 7E and 7F have a smaller value than the entrance and exit loss coefficients $e_{f1}$ and $e_{f2}$ represented by the above equation (2).

Although not shown in FIGS. 7A to 7F, the drive IC 100 may have a bump having a circle shape, a pentagon, an octagon and so on so as to reduce the entrance and exit loss coefficients $e_{f1}$ and $e_{f2}$.

The entrance loss coefficient En of the bumps "B" shown in FIGS. 7A to 7F is set forth in "Transport Phenomena in Material Processing", published in 1994 and written by D. R. Poirier and G. H. Geiger.

Figure 8:
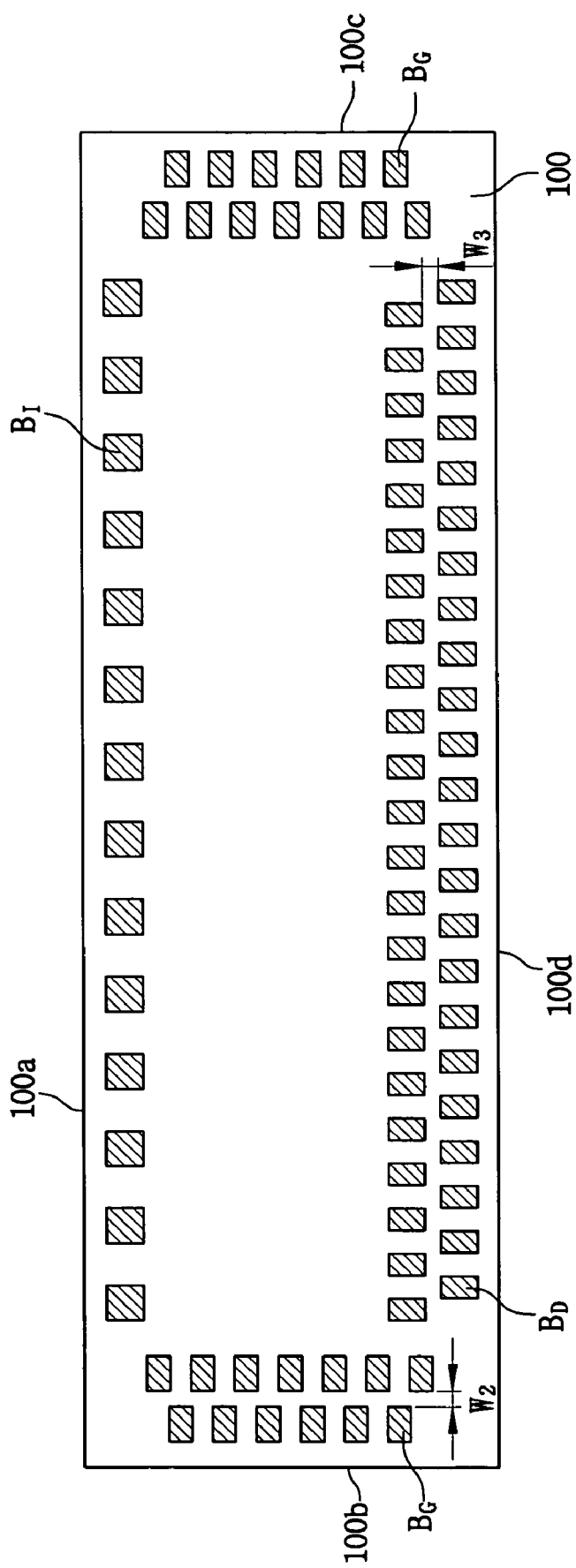
FIG. 8 is a schematic view showing a drive IC according to another exemplary embodiment of the present invention.

FIG. 8 is a schematic view showing a drive IC according to another exemplary embodiment of the present invention.

Referring to FIG. 8, a drive IC 100 includes a plurality of electrode terminals (not shown) formed on a lower surface thereof facing an LCD panel and a plurality of input line bumps $B_I$, a plurality of gate line bumps $B_G$ and a plurality of data line bumps $B_D$ disposed on the input line electrode terminals (see FIG. 2), respectively.

The input line bumps $B_I$ are arranged along a first edge 100a of the lower surface of the drive IC 100.

The gate line bumps $B_G$ are arranged in two columns along second and third edges 100b and 100c of the drive IC 100, respectively. The gate line bumps $B_G$ arranged in different columns from each other are spaced apart from each other with a second distance $W_2$. The second distance $W_2$ is greater than a half of a length of the gate line bumps BG. Also, the gate line bumps $B_G$ arranged in a first column between the two columns are positioned at areas corresponding to spaces between the gate line bumps $B_G$ arranged in a second column between the two columns.

The data line bumps $B_D$ are arranged in two rows along a fourth edge 100d parallel to the first edge 100a and the data line bumps $B_D$ arranged in different rows from each other are spaced apart from each other with a third distance $W_3$. The third distance $W_3$ is greater than a half of a length of the data line bumps $B_D$. Also, the data line bumps $B_D$ arranged in a first row between the two rows are positioned at areas corresponding to spaces between the data line bumps $B_D$ arranged in a second row between the two rows.

In FIG. 8, the gate line bumps $B_G$ and the data line bumps $B_D$ of the drive IC 100 arranged in two columns or rows have been described. However, the gate line bumps $B_G$ and the data line bumps $B_D$ may be arranged in three or more columns or rows, respectively. Also, a number of the gate line bumps $B_G$ and data line bumps $B_D$ may increase or decrease according to the LCD device 1000.

Figure 9:
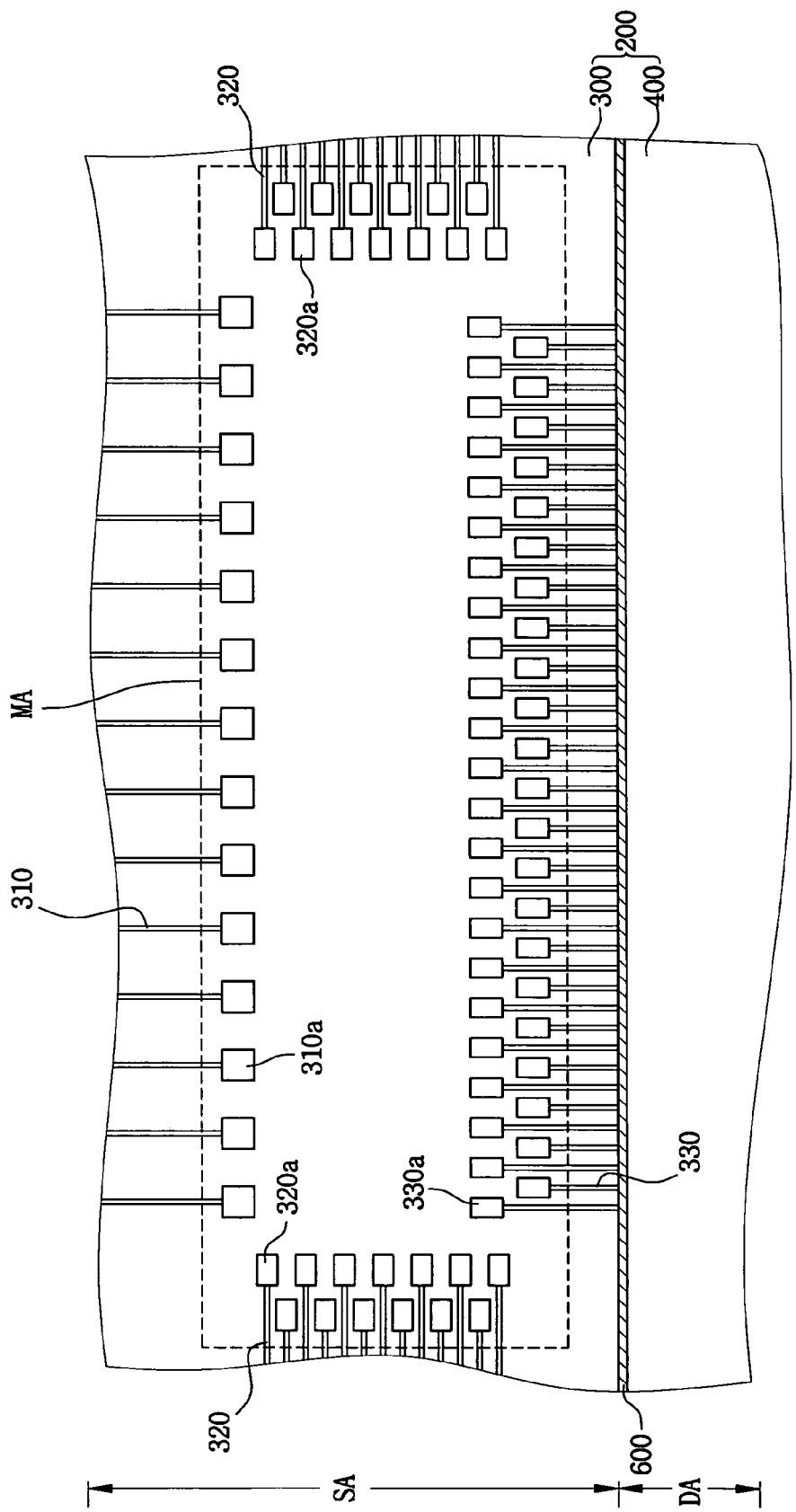
FIG. 9 is a partially enlarged view showing a peripheral area of an LCD panel on which a drive IC is mounted shown in FIG. 8.

FIG. 9 is a partially enlarged view showing a peripheral area of a liquid crystal display panel on which a drive IC is mounted shown in FIG. 8.

Referring to FIG. 9, a peripheral area SA of the LCD panel 200 is provided with a mounting area MA on which the drive IC 100 is mounted shown in FIG. 8.

A plurality of input line electrode pads 310a, a plurality of gate line electrode pads 320a and a plurality of data line electrode pads 330a are formed at the mounting area MA.

The gate line electrode pads 320a are arranged in two columns and the data line electrode pads 330a are arranged in two columns within the mounting area MA.

The gate line electrode pads 320a are arranged at positions corresponding to the gate line bumps $B_G$ of the drive IC 100 shown in FIG. 2 and the data line electrode pads 330a are arranged at positions corresponding to the data line bumps $B_D$ of the drive IC 100 shown in FIG. 2.

That is, the gate line electrode pads 320a arranged in a first column between the two columns are positioned at areas corresponding to spaces between the gate line electrode pads 320a arranged in a second column between the two columns.

The data line electrode pads 330a are arranged in a first column between the two columns are positioned at areas corresponding to spaces between the data line electrode pads 330a arranged in a second column between the two columns.

Figure 10:
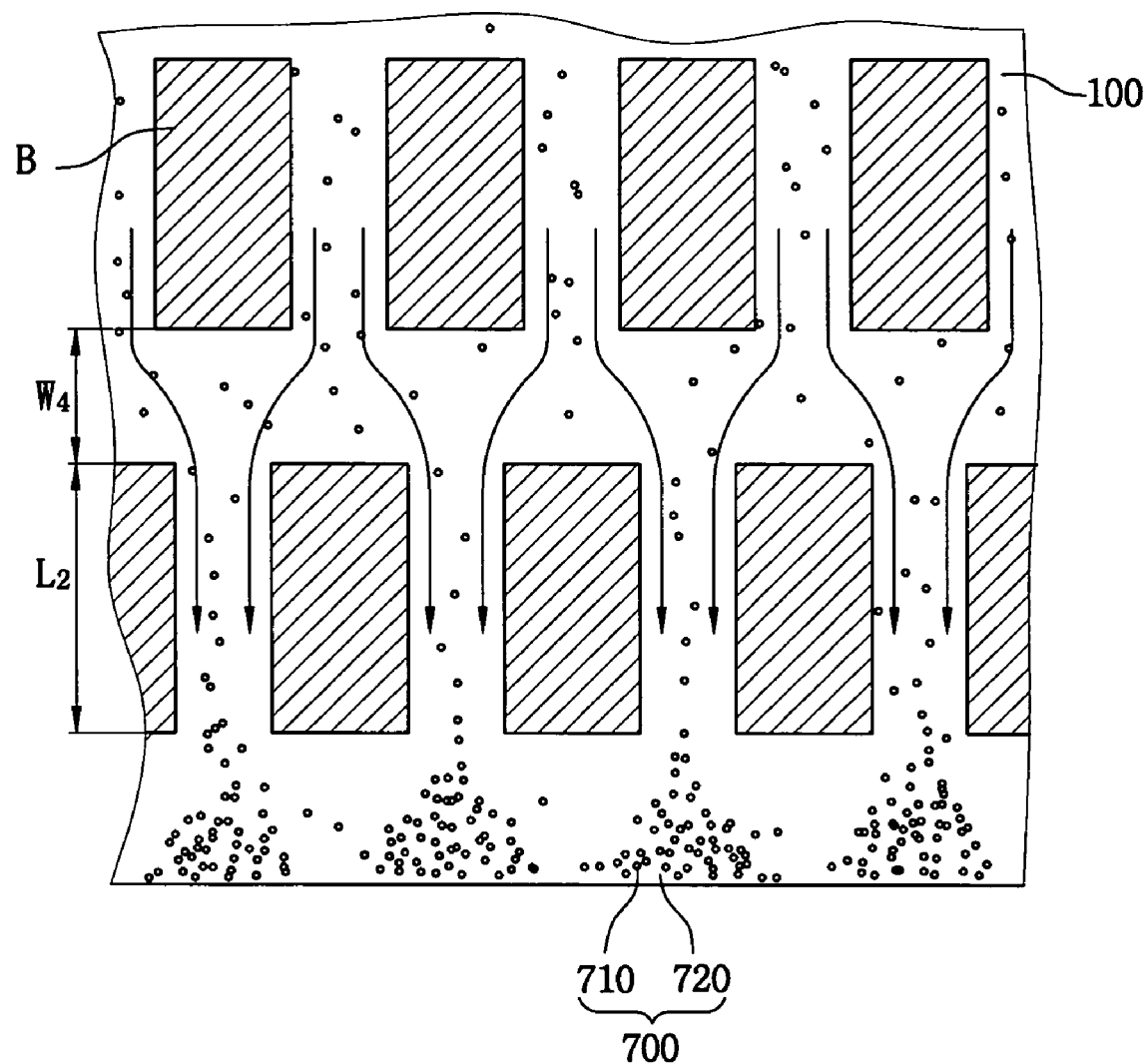
FIG. 10 is a partially enlarged view showing bumps of a drive IC shown in FIG. 8.

FIG. 10 is a partially enlarged view showing bumps of a drive IC shown in FIG. 8. In FIG. 10, the gate line bumps $B_G$ or data line bumps $B_D$ shown in FIG. 8 will be described as an exemplary embodiment and represented by a reference numeral "B".

Referring to FIG. 10, the bumps "B" of the drive IC 100 are arranged in two rows and each of the bumps "B" has a second length $L_2$ in a direction perpendicular to a direction in which the bumps "B" are arranged. The bumps "B", which are arranged in a same row and adjacent to each other, are separated from each other with a predetermined distance and the bumps "B", which are arranged in different rows, are spaced apart from each other with a fourth distance $W_4$. The fourth distance $W_4$ is greater than a half of the second length $L_2$.

When the drive IC 100 is mounted on the LCD panel 200 using the ACF 700 as shown in FIGS. 5A and 5B, the ACF 700 is extruded outside the drive IC 100 due to the compression of the drive IC 100.

The ACF 700 is extruded through a space between the bumps "B" spaced apart from each other with the fourth distance $W_4$. Also, a conductive ball 710 and a resin 720 mixed with the conductive ball 710 of the ACF 700 may be smoothly extruded outside the drive IC 100, thereby preventing the conductive ball from stacking around the bumps "B".

Figure 11A:
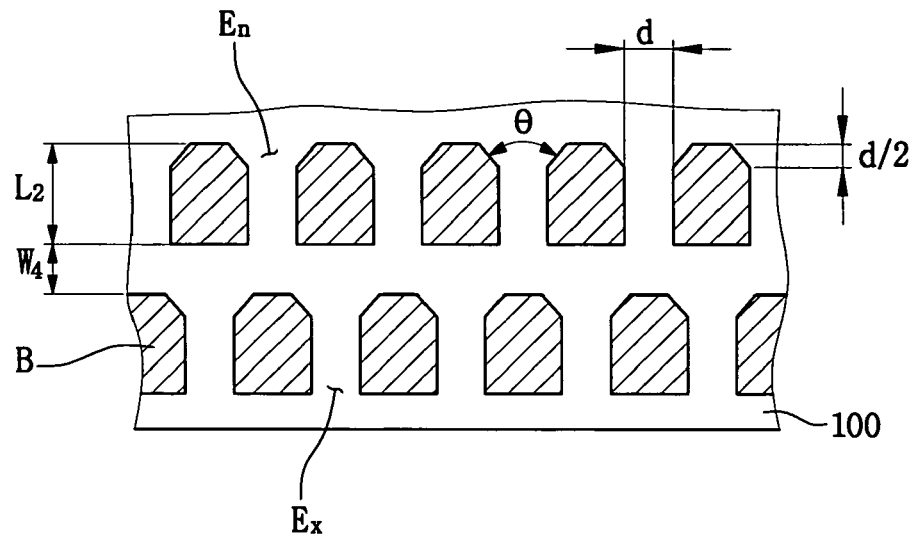
FIGS. 11A and 11B are partially enlarged views showing bump shapes of a drive IC according to another exemplary embodiment of the present invention.
Figure 11B:
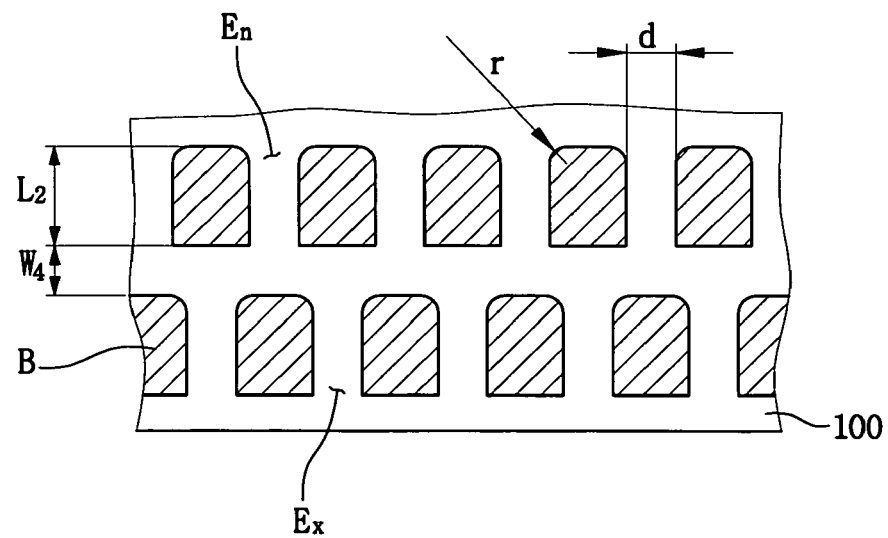

FIGS. 11A and 11B are partially enlarged views showing bump shapes of a drive IC according to another exemplary embodiment of the present invention.

Referring to FIGS. 11A and 11B, the bumps "B" of the drive IC 100 are arranged in two rows and each of the bumps "B" has the second length $L_2$ in a direction perpendicular to a direction in which the bumps "B" are arranged. The bumps "B", which are arranged in different rows, are spaced apart from each other with a fourth distance $W_4$. The fourth distance $W_4$ is greater than a half of the second length $L_2$.

In the drive IC 100 shown in FIG. 11A, corners of the bumps "B" that are adjacent to an entrance En are chamfered so as to reduce the frictional loss at the entrance En when the ACF 700 shown in FIG. 10 is flowed.

For example, assuming that an angle θ widened at the entrance En defined by the bumps "B" adjacent to each other is about 45 degrees and a depth of the widened entrance En is a half of a distance "d" between the bumps "B" adjacent to each other, the frictional loss at the entrance En may be reduced as described in FIG. 7A.

Although not shown in FIG. 11A, corners of the bumps "B" that are respectively adjacent to the entrance En and the exit Ex (not shown) may be chamfered so as to reduce the frictional loss at the exit Ex with the frictional loss at the entrance En.

In the drive IC 100 shown in FIG. 11B, corners of the bumps "B" that are adjacent to an entrance En are rounded so as to reduce the frictional loss of the ACF 700 when the ACF 700 shown in FIG. 10 is flowed.

For example, when a radius of curvature "r" of the rounded corners and a distance "d" between the bumps "B" arranged in a same row and adjacent to each other is satisfied a condition of r/d=0.1, the frictional loss at the entrance En may be reduced as described in FIG. 7C.

Although not shown in FIG. 11B, corners of the bumps "B" that are respectively adjacent to the entrance En and the exit Ex (not shown) may be rounded so as to reduce the frictional loss at the exit Ex with the frictional loss at the entrance En.

Also, in order to reduce the frictional loss at the entrance En and the exit Ex, the bumps "B" may have various shapes, for example, such as a circle shape, a pentagon, a hexagon and an octagon and so on.

FIG. 12 is a schematic view showing a drive IC according to another exemplary embodiment of the present invention.

Referring to FIG. 12, a drive IC 100 includes a plurality of electrode terminals (not shown) formed on a lower surface thereof facing an LCD panel and a plurality of input line bumps $B_I$, a plurality of gate line bumps $B_G$ and a plurality of data line bumps $B_D$ disposed on the input line electrode terminals, respectively.

The lower surface of the drive IC 100 is divided into an input line bump area $D_{IA}$ adjacent to a first edge 100a thereof, a gate line bump area $G_{OA}$ adjacent to a second edge 100b thereof and a data line bump area $D_{OA}$ adjacent to a third edge 100c thereof.

The input line bumps $B_I$ are arranged in an entire are of the input line bump area $D_{IA}$ along the first edge 100a and the input line bumps $B_I$ are arranged in two rows.

The gate line bumps $B_G$ are arranged in an entire are of the gate line bump area $G_{OA}$ along the second and third edges 100b and 100c, respectively. The gate line bumps $B_G$ are arranged in three columns.

The data line bumps $B_D$ are arranged in an entire area of the data line bump area $D_{OA}$ along the fourth edge 100d and the data line bumps $B_D$ are arranged in four rows.

As the above described, the input line bumps $B_I$, gate line bumps $B_G$ and data line bumps $B_D$ may be sufficiently spaced apart from each other since the input line bumps $B_I$, gate line bumps $B_G$ and data line bumps $B_D$ are arranged in the entire areas of the input line bump area $D_{IA}$, gate line bump area $G_{OA}$ and data line bump area $D_{OA}$.

In FIG. 12, the input line bumps $B_I$, gate line bumps $B_G$ and the data line bumps $B_D$ Of the drive IC 100 arranged in two, three and four columns or rows have been described. However, a number of the input line bumps $B_I$, gate line bumps $B_G$ and data line bumps $B_D$ may increase or decrease according to the LCD device 1000.

Figure 13:
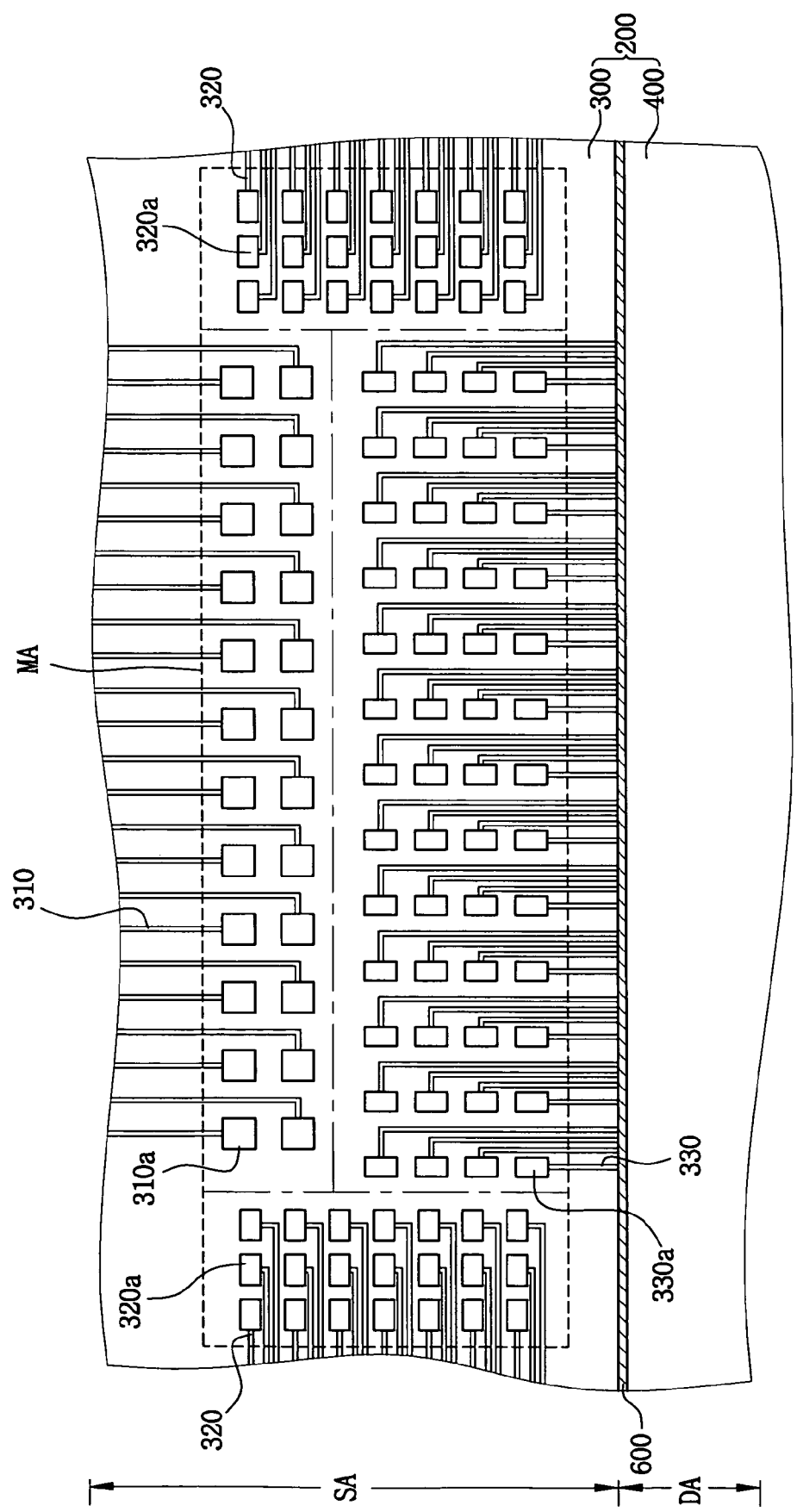
FIG. 13 is a partially enlarged view showing a peripheral area of an LCD panel on which a drive IC is mounted shown in FIG. 12.

FIG. 13 is a partially enlarged view showing a peripheral area of a liquid crystal display panel on which a drive IC is mounted shown in FIG. 12.

Referring to FIG. 13, a peripheral area SA of the LCD panel 200 is provided with a mounting area MA on which the drive IC 100 shown in FIG. 12 is mounted.

A plurality of input line electrode pads 310a, a plurality of gate line electrode pads 320a and a plurality of data line electrode pads 330a are formed at the mounting area MA.

The input line electrode pads 310a, gate line electrode pads 320a and data line electrode pads 330a are arranged in a plurality of columns or rows within the mounting area MA.

The input line electrode pads 310a, gate line electrode pads 320a and data line electrode pads 330a are arranged at positions corresponding to the input line bumps $B_I$, gate line bumps $B_G$ and data line bumps $B_D$, respectively. Therefore, an arrangement of the input line electrode pads 310a, gate line electrode pads 320a and data line electrode pads 330a will not be described in detail.

Similarly, since the drive IC 100 is mounted on the LCD panel 200 using the ACF 700 and the input line bumps $B_I$, gate line bumps $B_G$ and data line bumps $B_D$ are sufficiently spaced apart from each other, the ACF 700 may be smoothly flowed outside the drive IC 100.

Thus, the ACF 700 is not stacked up on the peripheral area of the input line bumps $B_I$, gate line bumps $B_G$ and data line bumps $B_D$, thereby improving an electrical reliability between the drive IC 100 and the LCD panel 200.

The drive IC 100 according to those exemplary embodiments of the present invention may be applied to an LCD device having the slim-type small size and an LCD device having an LCD panel that gate and data printed circuit boards are positioned at a peripheral area adjacent to the LCD panel.

Furthermore, in order to describe the drive IC according to those exemplary embodiments of the present invention, the LCD device 1000 having the LCD panel 200 has been described. However, the drive IC 100 according to those exemplary embodiments of the present invention may be applied to a display device of an organic electro-luminescence or a display device of a plasma display panel.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A circuit device comprising:
a first, second and third plurality of electrode terminals, each plurality of electrode terminals being linearly aligned in a plurality of columns along a first direction parallel to an edge line of a semiconductor substrate and linearly aligned in a plurality of rows along a second direction perpendicular to the first direction; and
bumps disposed on the first, second and third plurality of electrode terminals,
wherein distances between adjacent two electrode terminals for each respective first, second and third plurality of electrode terminals aligned in the second direction from respective adjacent columns are uniform.

2. The circuit device of claim 1, wherein each of the bumps on at least one of the first, second and third plurality of electrode terminals has a rectangular shape when viewed from an upper side of the bumps.

3. The circuit device of claim 2, wherein each of the bumps has at least one chamfered corner portion.

4. The circuit device of claim 2, wherein each of the bumps has at least one rounded corner portion.

5. The circuit device of claim 1, wherein each of the bumps on at least one of the first, second and third plurality of electrode terminals has a pentagon, a hexagon, an octagon or a circle shape when viewed from an upper side of the bumps.

6. A display device comprising:
a display panel having a display area on which a gate line, a data line perpendicular to the gate line and a plurality of pixels are formed and a peripheral area on which electrode pads extended from the gate and data lines are formed, the peripheral area being disposed adjacent to the display area; and
a drive IC having a first, second and third plurality of electrode terminals, each plurality of electrode terminals being linearly aligned in a plurality of columns along a first direction parallel to an edge line of a semiconductor substrate and linearly aligned in a plurality of rows along a second direction perpendicular to the first direction and bumps disposed on the first second and third plurality of electrode terminals, the drive IC being electrically connected to the electrode pads,
wherein distances between adjacent two electrode terminals for each respective first, second and third plurality of electrode terminal aligned in the second direction from respective adjacent columns are uniform.

7. The display device of claim 6, wherein the electrode pads are positioned at the peripheral area, aligned in the plurality of columns along the first direction and aligned in the plurality of rows along the second direction perpendicular to the first direction.

8. The display device of claim 6, wherein each of the bumps on at least one of the first, second and third electrode terminals has a rectangular shape when viewed from an upper side of the bumps.

9. The display device of claim 8, wherein each of the bumps has at least one chamfered corner portion.

10. The display device of claim 8, wherein each of the bumps has at least one rounded corner portion.

11. The display device of claim 6, wherein the drive IC is electrically connected to the display panel by means of an anisotropic conductive film.

12. The display device of claim 6, wherein the display panel is a liquid crystal display panel that displays an image by driving a liquid crystal.

* * * * *